(12) United States Patent
Aharoni

(10) Patent No.: US 9,882,003 B1
(45) Date of Patent: Jan. 30, 2018

(54) DEVICE AND SYSTEM OF A SILICON CONTROLLED RECTIFIER (SCR)

(71) Applicant: Tower Semiconductor Ltd., Migdal Haemek (IL)

(72) Inventor: Efraim Aharoni, Haifa (IL)

(73) Assignee: TOWER SEMICONDUCTOR LTD., Migdal Haemek (IL)

( * ) Notice: Subject to any disclaimer, the term of this patent is extended or adjusted under 35 U.S.C. 154(b) by 0 days.

(21) Appl. No.: 15/206,532

(22) Filed: Jul. 11, 2016

(51) Int. Cl.
| | | |
|---|---|---|
| *H01L 29/66* | (2006.01) | |
| *H01L 29/08* | (2006.01) | |
| *H01L 29/49* | (2006.01) | |
| *H01L 29/78* | (2006.01) | |
| *H01L 27/02* | (2006.01) | |
| *H01L 27/092* | (2006.01) | |

(52) U.S. Cl.
CPC ...... *H01L 29/0847* (2013.01); *H01L 27/0266* (2013.01); *H01L 27/0928* (2013.01); *H01L 29/4916* (2013.01); *H01L 29/7833* (2013.01)

(58) Field of Classification Search
CPC ............. H01L 29/0847; H01L 29/4916; H01L 29/7833; H01L 27/0928; H01L 27/0266
USPC ........................................ 257/133, 336, 356
See application file for complete search history.

(56) References Cited

U.S. PATENT DOCUMENTS

| 5,455,436 | A  | * | 10/1995 | Cheng ................. H01L 27/0262 257/356 |
| 6,323,074 | B1 | * | 11/2001 | Jiang ................... H01L 27/0266 438/201 |
| 6,963,109 | B2 | * | 11/2005 | Kikuchi .............. H01L 29/0847 257/335 |
| 2002/0122280 | A1 | | 9/2002 | Ker et al. |
| 2003/0058592 | A1 | | 3/2003 | Hung et al. |
| 2003/0076636 | A1 | | 4/2003 | Ker et al. |
| 2003/0214773 | A1 | | 11/2003 | Kitagawa |
| 2004/0042143 | A1 | | 3/2004 | Ker et al. |
| 2006/0097322 | A1 | | 5/2006 | Kwak et al. |
| 2007/0045656 | A1 | | 3/2007 | Chen |
| 2007/0058307 | A1 | | 3/2007 | Mergens et al. |
| 2008/0062607 | A1 | | 3/2008 | Cheng et al. |
| 2008/0123230 | A1 | | 5/2008 | Yun |
| 2008/0157204 | A1 | | 7/2008 | Song |
| 2011/0032648 | A1 | | 2/2011 | Darthenay et al. |

* cited by examiner

*Primary Examiner* — Long K Tran
(74) *Attorney, Agent, or Firm* — Shichrur & Co.

(57) ABSTRACT

Some demonstrative embodiments include devices and/or systems of a Silicon Controlled Rectifier (SCR). For example, a silicon controlled rectifier (SCR) may include a metal-oxide-semiconductor field-effect transistor (MOSFET), the MOSFET may include a gate; an N-type source region; a non-Lightly Doped Drain (LDD) N-type drain region; and a P-Well region extending between the N-type source region and the non-LDD N-type drain region, and extending between the non-LDD N-type drain region and a drain region of the gate.

22 Claims, 10 Drawing Sheets understood by persons of ordinary skill in the art that some embodiments may be practiced without these specific details. In other instances, well-known methods, procedures, components, units and/or circuits have not been described in detail so as not to obscure the discussion.

DEVICE AND SYSTEM OF A SILICON CONTROLLED RECTIFIER (SCR)

TECHNICAL FIELD

Embodiments described herein generally relate to a Silicon Controlled Rectifier (SCR).

BACKGROUND

A Silicon Controlled Rectifier (SCR) is configured to shunt electro static discharge (ESD) currents from electrical components of an intergraded circuit (IC).

Shunting the ESD currents may prevent damage to the electrical components of the IC.

The SCR is configured to be triggered at a predefined ESD voltage value ("triggering voltage"), to shunt the ESD currents from the electrical components.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
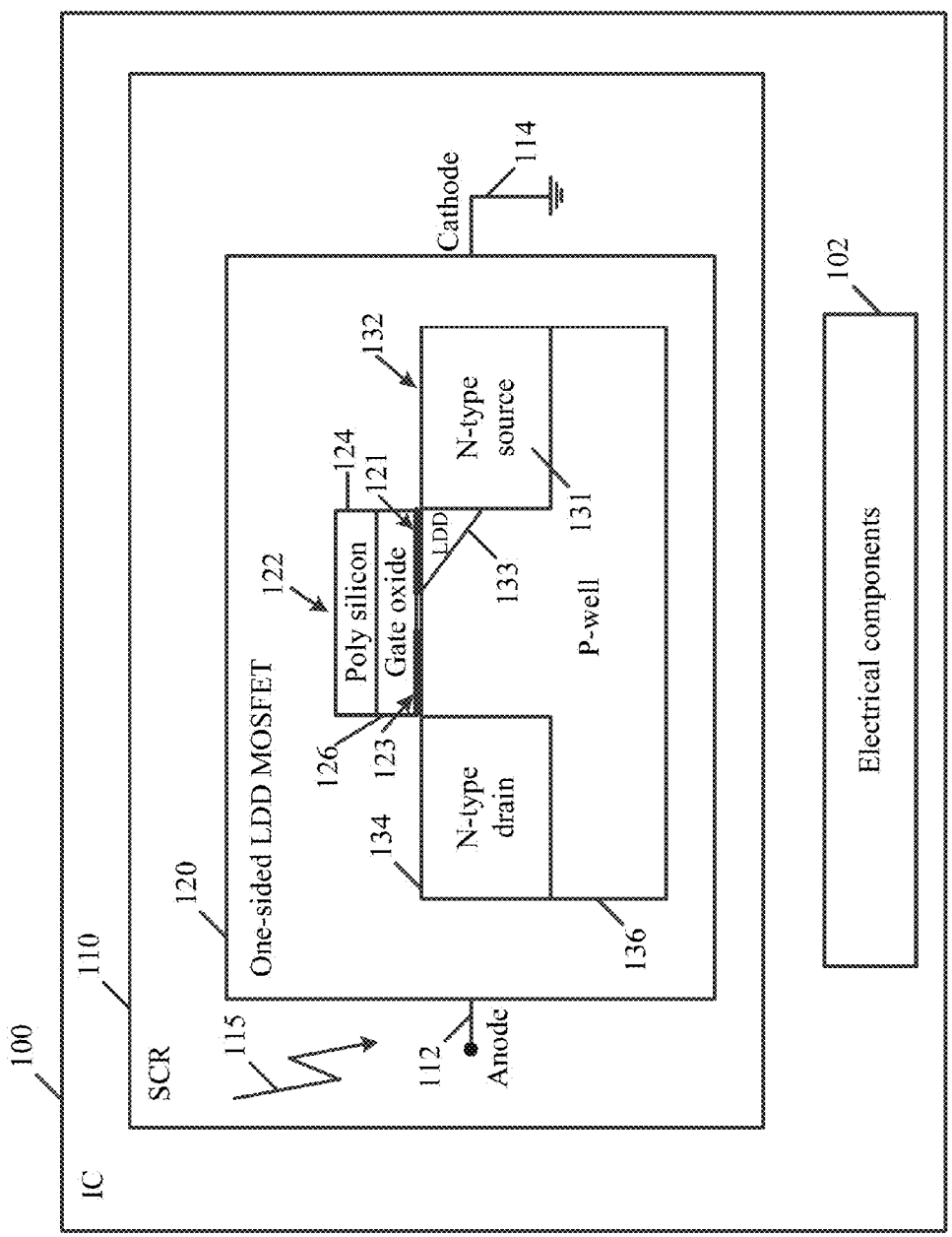
FIG. 1 is a schematic block diagram illustration of an integrated chip (IC), in accordance with some demonstrative embodiments.

In the following detailed description, numerous specific details are set forth in order to provide a thorough understanding of some embodiments. However, it will be under Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, an electronic device, a computing device, an integrated computing device, an integrated chip, electronic circuitry, a processing device, an electrical device, a processor, a memory device, an imaging device, a digital camera device, a video device, a camera module, a medical imaging device, a mobile computer, a laptop computer, a notebook computer, a tablet computer, a handheld computer, a handheld device, a Personal Digital Assistant (PDA) device, a handheld PDA device, a mobile or portable device, a consumer device, a Smartphone and the like.

The terms "substrate" and/or "wafer", as used herein, may relate to a thin slice of semiconductor material, for example, a silicon crystal, which may be used in fabrication of integrated circuits and/or any other microelectronic devices. For example, the wafer may serve as the substrate for the microelectronic devices, which may be built in and over the wafer.

The term "Integrated Circuit" (IC), as used herein, may relate to a set of one or more electronic circuits on a semiconductor material. For example, the electronic circuit may include electronic components and their interconnectors.

The term "active area", as used herein, may relate to an area on top of a substrate on which one or more electronic components are integrated. For example, the active area may include one or more integrated electronic components and their interconnectors.

Reference is made to FIG. 1, which schematically illustrates a block diagram of an integrated circuit (IC) 100, in accordance with some demonstrative embodiments.

In some demonstrative embodiments, IC 100 may include a complementary metal-oxide-semiconductor (CMOS) IC formed on a wafer.

In some demonstrative embodiments, a plurality of ICs 100 may be formed on the wafer, e.g., in addition to IC 100.

In some demonstrative embodiments, IC 100 may include and/or may be part of an electronic device.

In some demonstrative embodiments, IC 100 may include at least one electrical component 102, for example, to operate the electronic device and/or to perform one or more operations and/or functionalities of the electronic device.

In some demonstrative embodiments, IC 100 may include at least one silicon controlled rectifier 110 (SCR) configured to shunt electro static discharge (ESD) currents from electrical component 102 of IC 100.

In some demonstrative embodiments, SCR 110 may include an anode 112 and a cathode 114.

In some demonstrative embodiments, SCR 110 may be configured to shunt ESD currents from the electrical component 102, e.g., from anode 112 to cathode 114, for example, responsive to a predefined ESD voltage (also referred to as "Vt1"), e.g., a triggering voltage 115.

In some demonstrative embodiments, an SCR may be composed of four adjacent N-doped (n) and P-doped (p) diffusions situated in N-well and P-well regions, e.g., as described below. This construction may cause a parasitic circuit of vertical pnp and lateral npn bipolar devices to be triggered during an ESD event and to hold an ESD current conductance, e.g., during sufficient time, to discharge the ESD current through a low impedance path, e.g., from anode 112 to cathode 114.

In some demonstrative embodiments, shunting the ESD currents from electrical component 102 may prevent damage to the electrical component 102 of the IC 100.

In some demonstrative embodiments, SCR 110 may be configured to minimize impact between SCR 110 and the electrical component 102.

In some demonstrative embodiments, SCR 110 may be configured such as to not substantially interfere with a functionality of IC 100 and/or not substantially degrade performance of IC 100.

In some demonstrative embodiments, SCR 110 may be configured to be in an off state during normal operation of IC 100, e.g., a state having a minimum leakage current during the normal operation of IC 100.

In some demonstrative embodiments, SCR 110 may be configured to consume a low area of IC 100.

In one example, consuming the low area of SCR 110 may be crucial, for example, when high rating electro static discharge (ESD) specifications are addressed, e.g., as descried below.

In another example, some applications, which may utilize high frequency inputs, may require low capacitive load of SCR 110.

In some demonstrative embodiments, SCR 110 may provide an advantageous ESD rating protection per device width or per area of IC 100.

In some demonstrative embodiments, SCR 110 may have a relatively low parasitic capacitance, for example, compared to standard ESD transistors, which may be commonly used for ESD protection.

In some demonstrative embodiments, SCR 110 may include a lateral Low Voltage Triggered SCR (LVTSCR).

In some demonstrative embodiments, an LVTSCR may enable high ESD current, with a low area, a low Ron metric, a low voltage drop, and/or a low parasitic capacitance.

In some demonstrative embodiments, an LVTSCR may achieve lower voltage values of triggering voltage 115 to trigger SCR 110, for example, compared to a lateral SCR and/or a Middle Voltage Triggered SCR (MVTSCR).

However, the lower voltage values of an LVTSCR may still be too high and may not be used as an ESD protection device although its advantages, for example, if SCR 110 includes a two-sided Lightly Doped Drain (LDD) LVTSCR, e.g., as described below.

In one example, the lower voltage values of the two-sided LDD LVTSCR may be between 12-14 Volt (V), which may be above a typical operational voltage, e.g., operational voltages of 3.3V and 5V, of electronic devices used in typical IO circuits and, accordingly, the lower voltage values may not protect IC 100. For example, if the voltage values of triggering voltage 115 are between 4-12V, the two-sided LDD LVTSCR may not prevent damage to IC 100, e.g., if an operational voltage of IC 100 is 3.3V.

Figure 2:
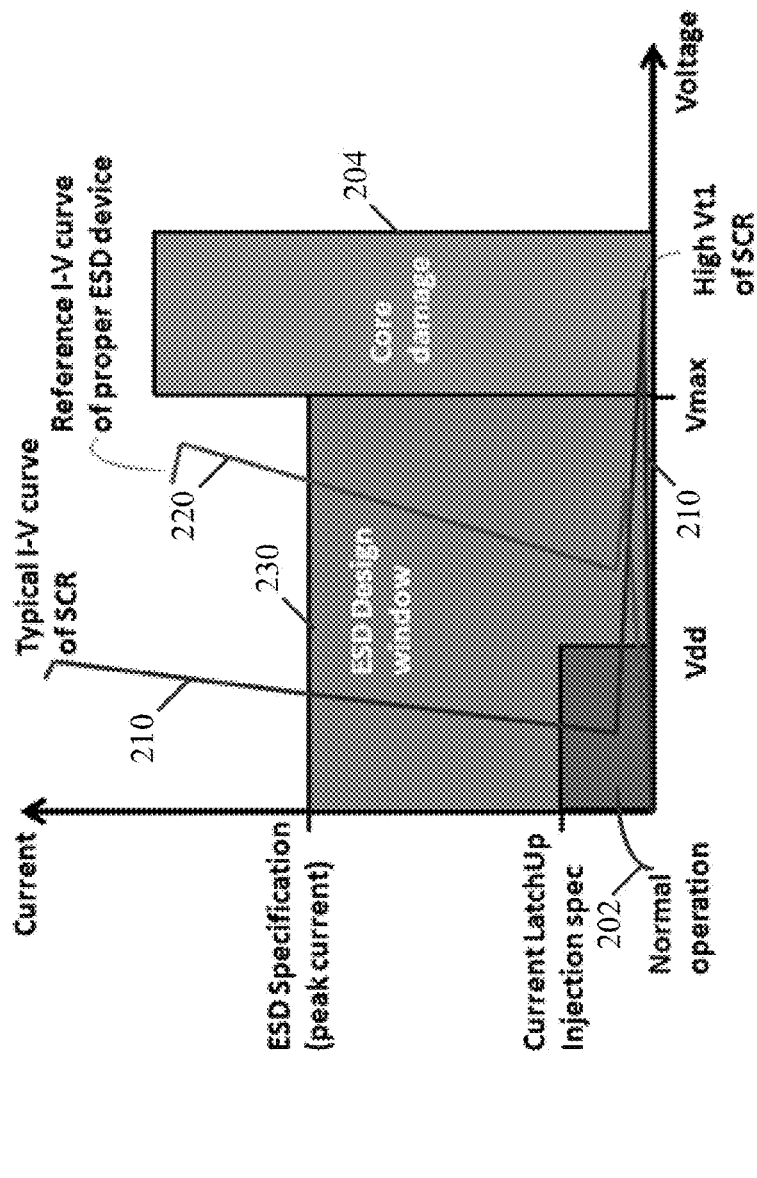
FIG. 2 is a schematic illustration of a graph depicting voltage versus current of a Silicon Controlled Rectifier (SCR), in accordance with some demonstrative embodiments.

Reference is made to FIG. 2, which schematically illustrates a graph 200 depicting voltage versus current of an SCR, in accordance with some demonstrative embodiments.

As shown in FIG. 2, an electrical device may operate in a normal operation window 202.

As shown in FIG. 2, one or more electrical components of the electrical device, e.g., electrical component 102 (FIG. 1), may be damaged, for example, if an SCR does not shunt ESD currents, responsive to an ESD voltage, during normal operation of the electrical device.

As shown in FIG. 2, an SCR may not protect the electrical component, for example, if the SCR does not shunt ESD currents, which cross a core damage window 204.

As shown in FIG. 2, an SCR may protect the electrical component, for example, if the SCR operates within an ESD design window 230, and shunts the ESD currents within ESD design window 230.

As shown in FIG. 2, a first SCR, having a high triggering voltage may have a first current-voltage curve 210.

As shown in FIG. 2, the first SCR may not protect the electrical components, e.g., since current-voltage curve 210 crosses core damage window 204.

As shown in FIG. 2, a second SCR, having a lower triggering voltage, e.g., lower than the triggering voltage of the first SCR, may have a second current-voltage curve 220.

As shown in FIG. 2, the second SCR may protect the electrical components, e.g., since current-voltage curve 220 not crosses core damage window 204 and is within ESD design window 230.

In one example, first current-voltage curve 210 and/or second current-voltage curve 220 may be measured using a Transmission Line Pulse (TLP).

Referring back to FIG. 1, some demonstrative embodiments may enable reducing the voltage values of triggering voltage 115 to trigger SCR 110.

Some demonstrative embodiments may enable reducing the voltage values of triggering voltage 115, for example, without impact on a device parasitic capacitance and/or normal operation of IC 100.

Some demonstrative embodiments may enable, for example, achieving reduced or even no leakage current through SCR 110 in an off state of SCR 110, e.g., during normal operation of IC 100.

Some demonstrative embodiments may enable, for example, reduced or even no degradation of a second breakdown, e.g., $it_2$, of IC 100.

Some demonstrative embodiments may enable, for example, to accurately control and/or modify triggering voltage values, e.g., at high resolution and/or repeatability, to a required triggering voltage value, for example, during a production of IC 100.

In one example, controlling the triggering voltage values can be achieved, for example, directly through device or a pcell parameter, e.g., without using an additional complicating circuit.

In some demonstrative embodiments, controlling and/or modifying the triggering voltage values may enable production of ESD protection circuits for a variety of cases and/or a variety of pins structures, for example, a power clamp, a protecting I/O and a primary or secondary ESD protection circuit.

In some demonstrative embodiments, SCR 110 may include a one-sided LDD LVTSCR (also referred to as "a source-side LDD LVTSCR").

In some demonstrative embodiments, the one-sided LDD LVTSCR may enable reducing voltage values, for example, even without impact on a device parasitic capacitance and/or normal operation of IC 100, e.g., as described below.

In some demonstrative embodiments, SCR 110 may include a metal-oxide-semiconductor field-effect transistor (MOSFET) 120.

In some demonstrative embodiments, MOSFET 120 may include a one-sided LDD N-type MOSFET, e.g., as described below.

In some demonstrative embodiments, the lower voltage values of triggering voltage 115 may be achieved, for example, by including the one-sided LDD N-type MOSFET in SCR 110.

In some demonstrative embodiments, MOSFET 120 may include a gate 122.

In some demonstrative embodiments, gate 122 may include a polysilicon layer 124 and a gate oxide layer 126.

In one example, gate 122 may be in the path of ESD currents, and a voltage value to trigger SCR 110 may be defined by creation of charge carriers in MOSFET 120, for example, close to an off-state punch through voltage, e.g., a Breakdown Voltage ($BV_{DSS}$).

In some demonstrative embodiments, MOSFET 120 may include an N-type source region 132.

In some demonstrative embodiments, N-type source region 132 may include N-type diffusion of a portion of gate 122, which is closer to cathode 114.

In some demonstrative embodiments, MOSFET 120 may include an N-type drain region 134.

In some demonstrative embodiments, N-type drain region 134 may include N-type diffusion of a portion of gate 122, which is closer to anode 112.

In some demonstrative embodiments, MOSFET 120 may include a P-well region 136.

In some demonstrative embodiments, the P-Well region 136 may extend between the N-type source region 132 and the N-type drain region 134.

In some demonstrative embodiments, from the N-type drain region 134 and the N-type source region 132, only the N-type source region 132 includes an LDD N-type region 133.

In some demonstrative embodiments, the N-type source region 132 may include a heavily doped region 131 and the LDD N-Type region 133.

In some demonstrative embodiments, the LDD N-Type region 133 may include light N-type doping.

In some demonstrative embodiments, the heavily doped region 131 may include heavy N-type doping.

In some demonstrative embodiments, the LDD N-Type region 133 may extend between the P-well region 136 and a source region 121 of the gate 122.

In some demonstrative embodiments, source region 121 of the gate 122 may include a portion of gate 122 underneath gate oxide 126, e.g., which is closer to N-type source region 132.

In some demonstrative embodiments, the LDD N-Type region 133 may be in direct contact with the source region 121 of the gate 122.

In some demonstrative embodiments, the N-type drain region 134 may include a non-LDD N-type drain region.

In some demonstrative embodiments, the N-type drain region 134 may not include any light N-type doping, for example, in contrast to N-type source region 132, which includes LDD N-Type region 133.

In some demonstrative embodiments, the N-type drain region 134 may be heavily doped. For example, the N-type drain region 134 may include heavily doped N-type diffusion.

In some demonstrative embodiments, an entirety of N-type drain region 134 may be uniformly doped. For example, the entirety of N-type drain region 134 may be uniformly doped with heavily doped N-type diffusion.

In some demonstrative embodiments, the P-Well region 136 may extend between the N-type drain region 134 and a drain region 123 of the gate 122.

In some demonstrative embodiments, drain region 123 of the gate 122 may include a portion of gate 122 underneath gate oxide 126, e.g., which is closer to N-type drain region 134.

In some demonstrative embodiments, the P-Well region 136 may be in direct contact with the drain region 123 of the gate 122.

In some demonstrative embodiments, the P-Well region 136 may fill an entire area under the drain region 123 of the gate 122.

In some demonstrative embodiments, a gate length of gate 122 may be based on the voltage value of the triggering voltage 115.

In one example, reducing the gate length of gate 122 may reduce the voltage value of triggering voltage 115, e.g., to trigger SCR 110, and/or increasing the gate length of gate 122 may increase the voltage value of triggering voltage 115, e.g., to trigger SCR 110.

In some demonstrative embodiments, reducing the gate length of gate 122, e.g., to reduce the voltage value to trigger SCR 110, may enable, for example, a simple control of a required voltage Vt1 for various ESD protection circuits, e.g., by one device layout parameter, and/or without using an additional circuit or an external triggering element, which may make more flexible design of ESD protection circuits.

Some demonstrative embodiments may enable reducing a triggering voltage of an SCR, e.g., SCR 110, for example, by using a different construction of an SCR, e.g., different from the construction of the one-sided/source-sided LDD LVTSCR.

In some demonstrative embodiments, an SCR, e.g., SCR 110, may include a non-LDD LVTSCR, e.g., as described below.

In some demonstrative embodiments, the non-LDD LVTSCR may include a non-LDD N-type MOSFET, e.g., as described below.

In some demonstrative embodiments, the non-LDD LVTSCR may include an N-type drain region and an N-type source region, which do not include any light N-type doping, e.g., as described below with reference to FIG. 3.

Figure 3:
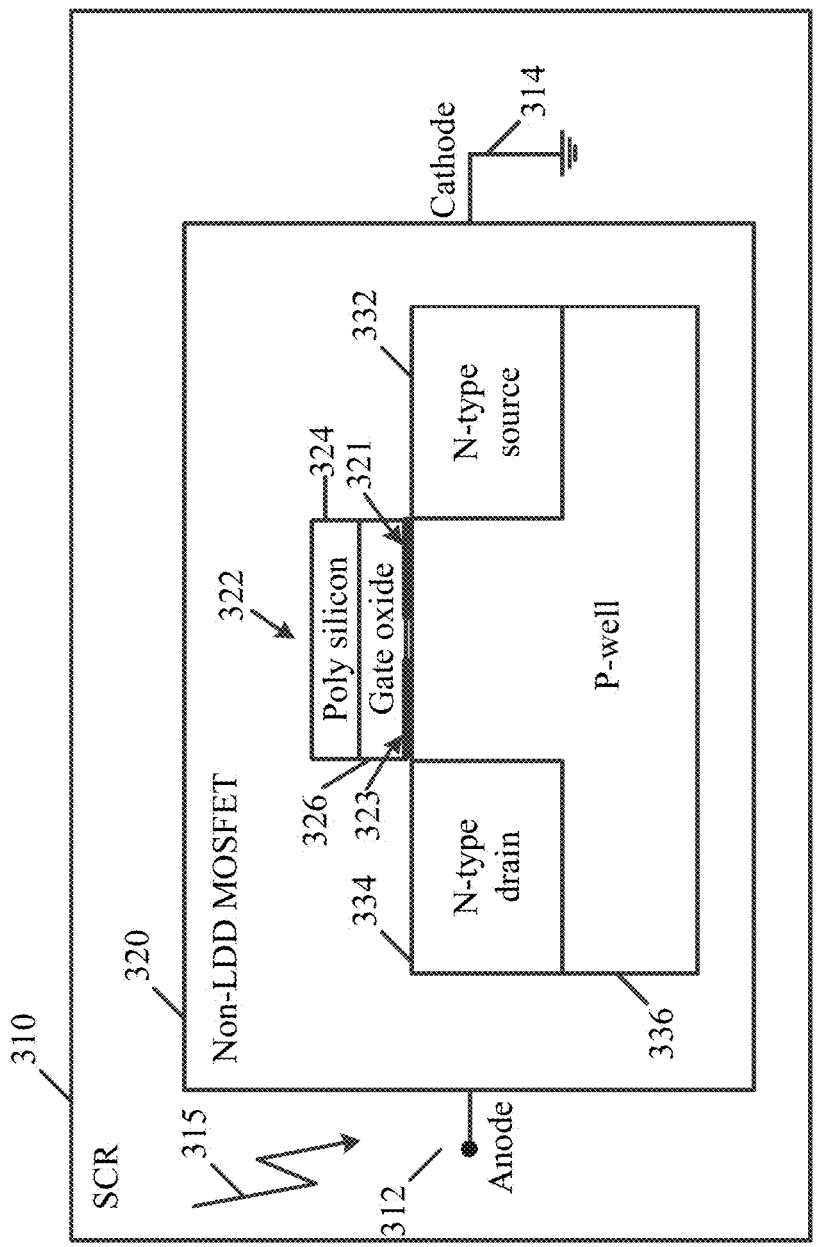
FIG. 3 is a schematic illustration of an SCR, in accordance with some demonstrative embodiments.

Reference is made to FIG. 3, which schematically illustrates an SCR 310, in accordance with some demonstrative embodiments.

In some demonstrative embodiments, SCR 310 may include a non-LDD LVTSCR, e.g., as described below.

In some demonstrative embodiments, as shown in FIG. 3, SCR 310 may include an anode 312 and a cathode 314.

In some demonstrative embodiments, the non-LDD LVTSCR may include a non-LDD N-type MOSFET 320.

In some demonstrative embodiments, as shown in FIG. 3, the non-LDD MOSFET 320 may include a gate 322.

In some demonstrative embodiments, as shown in FIG. 3, gate 322 may include a polysilicon layer 324 and a gate oxide layer 326.

In some demonstrative embodiments, as shown in FIG. 3, non-LDD MOSFET 320 may include a non-LDD N-type source region 332.

In some demonstrative embodiments, MOSFET 120 may include a non-LDD N-type drain region 334.

In some demonstrative embodiments, both non-LDD N-type source region 332 and non-LDD N-type drain region 334 may not include any light N-type doping, e.g., in contrast to N-type source region 132 (FIG. 1), which includes LDD N-Type region 133 (FIG. 1).

In some demonstrative embodiments, both non-LDD N-type source region 332 and non-LDD N-type drain region 334 may be heavily doped. For example, both non-LDD N-type source region 332 and non-LDD N-type drain region 334 may include heavily doped N-type diffusion.

In some demonstrative embodiments, both non-LDD N-type source region 332 and non-LDD N-type drain region 334 may be uniformly doped. For example, the entirety of both non-LDD N-type source region 332 and non-LDD N-type drain region 334 may be uniformly doped with heavily doped N-type diffusion.

In some demonstrative embodiments, as shown in FIG. 3, non-LDD MOSFET 320 may include a P-well region 336.

In some demonstrative embodiments, as shown in FIG. 3, the P-Well region 336 may extend between the non-LDD N-type source region 332 and the non-LDD N-type drain region 334.

In some demonstrative embodiments, as shown in FIG. 3, the P-Well region 336 may extend between the non-LDD N-type source region 332 and a source region 321 of the gate 322.

In some demonstrative embodiments, the source region 321 of gate 322 may include a portion of gate 322 underneath gate oxide 326, which is closer to N-type source region 332.

In some demonstrative embodiments, as shown in FIG. 3, the P-Well region 336 may extend between the non-LDD N-type drain region 334 and a drain region 323 of the gate 322.

In some demonstrative embodiments, the drain region 323 of gate 322 may include a portion of gate 322 underneath gate oxide 326, which is closer to N-type drain region 334.

In some demonstrative embodiments, as shown in FIG. 3, the P-Well region 336 may fill an entire area between the non-LDD N-type source region 332 and the non-LDD N-type drain region 334.

For example, as shown in FIG. 3, the P-Well region 336 may fill an entire area under the drain regions 321 and 323 of the gate 322.

In some demonstrative embodiments, as shown in FIG. 3, the P-Well region 336 may fill an entire area under the gate oxide layer 323 of gate 322.

In some demonstrative embodiments, as shown in FIG. 3, the P-Well region 336 may be in direct contact with an entire region of the gate 322 between the non-LDD N-type source region 332 and the non-LDD N-type drain region 334.

In some demonstrative embodiments, a gate length of gate 322 may be based, for example, at least on the voltage value of the triggering voltage 115 (FIG. 1) to be used for SCR 310.

In one example, reducing the gate length of gate 322 may reduce the voltage value of triggering voltage 115 (FIG. 1), e.g., which may trigger SCR 110 (FIG. 1); and/or increasing the gate length of gate 322 may increase the voltage value of triggering voltage 115 (FIG. 1), e.g., which may trigger SCR 110 (FIG. 1).

Referring back to FIG. 1, in some demonstrative embodiments, using one-sided LDD MOSFET 120 and/or non-LDD MOSFET 320 (FIG. 3) may enable to reduce a voltage value of triggering voltage 115, which may trigger an SCR, e.g., SCR 110 and/or SCR 310 (FIG. 3), for example, with respect to a specific configuration of one or more parameters of the SCR, e.g., the gate length.

In some demonstrative embodiments, the SCR including one-sided LDD MOSFET 120 and/or non-LDD MOSFET 320 (FIG. 3) may allow, for example, reducing the voltage value of triggering voltage 115, for example, even without affecting a normal operation of the SCR.

In some demonstrative embodiments, the SCR including one-sided LDD MOSFET 120 and/or non-LDD MOSFET 320 (FIG. 3) may allow, for example, reducing the voltage value of triggering voltage 115, for example, even without an excessive leakage current between a cathode and an anode of the SCR, e.g., during a normal operation of the SCR.

In one example, a power supply voltage to the SCR may be 3.3 Volt (V), and the width of the SCR may be 100 micrometer (um). According to this example, a triggering voltage to trigger the SCR may be less than or equal to 6.5V, and the leakage current may be less than 1 nanoAmper (nA).

In another example, the power supply voltage to the SCR may be 5V, and the width of the SCR may be 100 um. According to this example, the triggering voltage to trigger the SCR may be less than or equal to 8.5V, and the leakage current may be less than 1 nA.

In some demonstrative embodiments, the SCR including one-sided LDD MOSFET 120 and/or non-LDD MOSFET 320 (FIG. 3) may allow, for example, reducing the gate length of the gate, for example, even without affecting a normal operation of the SCR.

In some demonstrative embodiments, the SCR including one-sided LDD MOSFET 120 and/or non-LDD MOSFET 320 (FIG. 3) may allow, for example, reducing the gate length of the gate of the SCR, for example, even without an excessive leakage current between the cathode and the anode of the SCR, e.g., during a normal operation of the SCR.

In one example, the power supply voltage to the SCR may be 3.3V, and the width of the SCR may be 100 um. According to this example, the gate length of the gate of the SCR may be reduced, e.g., to 0.22 um, for example, while the leakage current may be less than 1 nA. According to this example, the gate length of the gate of the SCR may be reduced down to 0.18 um, for example, while the leakage current may be less than 10 picoAmper (pA).

In another example, the power supply voltage to the SCR may be 5V, and the width of the SCR may be 100 um. According to this example, the gate length of the gate of the SCR may be reduced, e.g., to 0.27 um, for example, while the leakage current may be less than 1 nA. According to this example, the gate length of the gate of the SCR may be reduced to 0.2 um, for example, while the leakage current may be less than 1 nA.

In some demonstrative embodiments, the SCR including one-sided LDD MOSFET 120 and/or non-LDD MOSFET 320 (FIG. 3) may allow, for example, using the SCR, for example, even without requiring any dynamic triggering, for example, by an external device and/or an external circuit, which may add to design complexity of an SCR and/or may require simulations and/or Si validation, e.g., to ensure sufficiently fast triggering and/or proper voltage clamping versus time.

In some demonstrative embodiments, the SCR including one-sided LDD MOSFET 120 and/or non-LDD MOSFET 320 (FIG. 3) may allow, for example, using the SCR, for example, even without requiring any modification of the process and/or layout of the SCR, which may increase an area of the SCR and/or may add additional process steps or layers, which may increase manufacturing cost of the SCR.

In some demonstrative embodiments, the SCR including one-sided LDD MOSFET 120 and/or non-LDD MOSFET 320 (FIG. 3) may allow, for example, using the SCR, for example, even without requiring use of an LVTSCR as a primary discharge with additional resistor and a secondary ESD device with a lower Vt1, for example, to input pin protection only and not to power clamp, and/or may require a very careful tailoring of a circuit for various ESD models.

In some demonstrative embodiments, the SCR including one-sided LDD MOSFET 120 and/or non-LDD MOSFET 320 (FIG. 3) may allow, for example, using the SCR, for example, even without requiring to use an ESD triggering and/or a detection circuit, e.g., to reduce the triggering voltage of the SCR.

In one example, the SCR including one-sided LDD MOSFET 120 and/or non-LDD MOSFET 320 (FIG. 3) may allow, for example, using the SCR, for example, even without requiring use of gate coupling, for example, using dynamic increase of Vgs during ESD events, e.g., like Gate Coupled NMOS.

In another example, the SCR including one-sided LDD MOSFET 120 and/or non-LDD MOSFET 320 (FIG. 3) may allow, for example, using the SCR, for example, even without requiring a substrate injection, for example, using an external trigger NMOS and/or any other substrate injection.

In some demonstrative embodiments, the gate coupling and/or the substrate injection may have one or more disadvantages, for example, the gate coupling and/or the substrate injection may result in a parasitic capacitance added to the input pin of an SCR; the gate coupling and/or the substrate injection may increase a design complexity of the SCR, e.g., it may be difficult to create a simple and/or a scalable parametric cell; the gate coupling and/or the substrate injection may be difficult to simulate in ESD checkers; the gate coupling and/or the substrate injection may add to ESD protection leakage; and/or the gate coupling and/or the substrate injection may be difficult to engineer, e.g., to relevant time scales, and/or in order to prevent false triggering.

In some demonstrative embodiments, the SCR including one-sided LDD MOSFET 120 and/or non-LDD MOSFET 320 (FIG. 3) may allow, for example, using the SCR, for example, even without requiring changing a process of production of the SCR and/or changing an internal structure of the SCR.

In one example, changing the process and/or the internal structure of the SCR may be disadvantageous, for example, as it may require additional layers and/or masks, may be difficult to adjust, e.g., to various process flavors of an IC, and/or may not enable a simple tuning of a triggering voltage of the SCR.

In some demonstrative embodiments, reducing only a gate length of a gate of an SCR, e.g., while using an LDD implant, to reduce a triggering voltage of the SCR, e.g., when charge carriers are created and the SCR is triggered, may cause a high leakage current, e.g., due to a source or drain punchthrough, and/or may result in a triggering voltage value, which may not be simply tuned.

In some demonstrative embodiments, the SCR including one-sided LDD MOSFET 120 and/or non-LDD MOSFET 320 (FIG. 3) may allow, for example, achieving lower triggering voltages, e.g., even without using an external circuit, e.g., to trigger the SCR.

In some demonstrative embodiments, the SCR including one-sided LDD MOSFET 120 and/or non-LDD MOSFET 320 (FIG. 3) may allow, for example, using the SCR, for example, to optimize the circuit and/or to ensure lower triggering voltage and/or an appropriate ESD Design Window, e.g., within design window 230 (FIG. 2), for example, even without any design complexity and/or a need for simulations, e.g., since there may be no need to use an external circuit.

In some demonstrative embodiments, the SCR including one-sided LDD MOSFET 120 and/or non-LDD MOSFET 320 (FIG. 3) may allow, for example, using the SCR, for example, even without adding any additional layers or process steps to the production of the SCR, e.g., which may increase the cost of the SCR.

In some demonstrative embodiments, the SCR including one-sided LDD MOSFET 120 and/or non-LDD MOSFET 320 (FIG. 3) may, for example, not modify a layout of the SCR, which may cause significant increase of an area of the SCR.

In some demonstrative embodiments, the SCR including one-sided LDD MOSFET 120 and/or non-LDD MOSFET 320 (FIG. 3) may allow, for example, to easily and/or repeatably tune the triggering voltage to a desired value, for example, using a simple scalable dimension, e.g., a gate length of gate 122.

In some demonstrative embodiments, the SCR including one-sided LDD MOSFET 120 and/or non-LDD MOSFET 320 (FIG. 3) may allow, for example, to keep a low leakage current of the SCR, for example, even without affecting a product total leakage.

In some demonstrative embodiments, the SCR including one-sided LDD MOSFET 120 and/or non-LDD MOSFET 320 (FIG. 3) may provide, for example, one or more advantages, e.g., over a two-sided LDD LVTSCR.

In one example, the one or more advantages may include, for example, design simplification, a reduction in parasitic capacitance of the SCR, No-false triggering events of the SCR, the SCR may be easier to simulate in ESD checkers, and/or the SCR may not have an extra leakage resulting from an additional triggering circuit, e.g., a Darlington cascaded devices, and/or one or more additional or alternative advantages.

In another example, the SCR including one-sided LDD MOSFET 120 and/or non-LDD MOSFET 320 (FIG. 3) may provide, for example, a simple method to tune a triggering voltage of an ESD device, e.g., for specific applications, for example, in a wide range, e.g., of few Volts, even without design effort, for example, using the same device and one layout parameter.

In some demonstrative embodiments, a leakage current of the SCR including one-sided LDD MOSFET 120 and/or non-LDD MOSFET 320 (FIG. 3), e.g., at normal operation, may be kept very low. For example, the absence of an LDD extension may prevent punchthrough and leakage current, for example, even at a very low gate length, which may be much shorter than a nominal transistor gate.

In some demonstrative embodiments, the SCR including one-sided LDD MOSFET 120 and/or non-LDD MOSFET 320 (FIG. 3), may allow, for example, a high resolution and/or repeatable control of a triggering voltage in a few volts range, which may enable, for example, adjustment to various implementations and/or ESD design windows.

In one example, the SCR including one-sided LDD MOSFET 120 and/or non-LDD MOSFET 320 (FIG. 3), may allow, for example, using the same ESD protection device in the same circuit, for example, to protect a variety of IC pins with various voltage ranges. For example, the SCR may be used for standard inputs like analog pins, and in parallel to protect pins with higher voltage, e.g., programming of Non-volatile Memory modules, which may require a relatively higher triggering voltage.

In some demonstrative embodiments, the ability to use the SCR for protection of a variety of IC pins with various voltage ranges may enable using the SCR for a variety of cases and/or pins, e.g., including power clamp, protecting I/O and/or primary/secondary ESD protection circuits.

Figure 4:
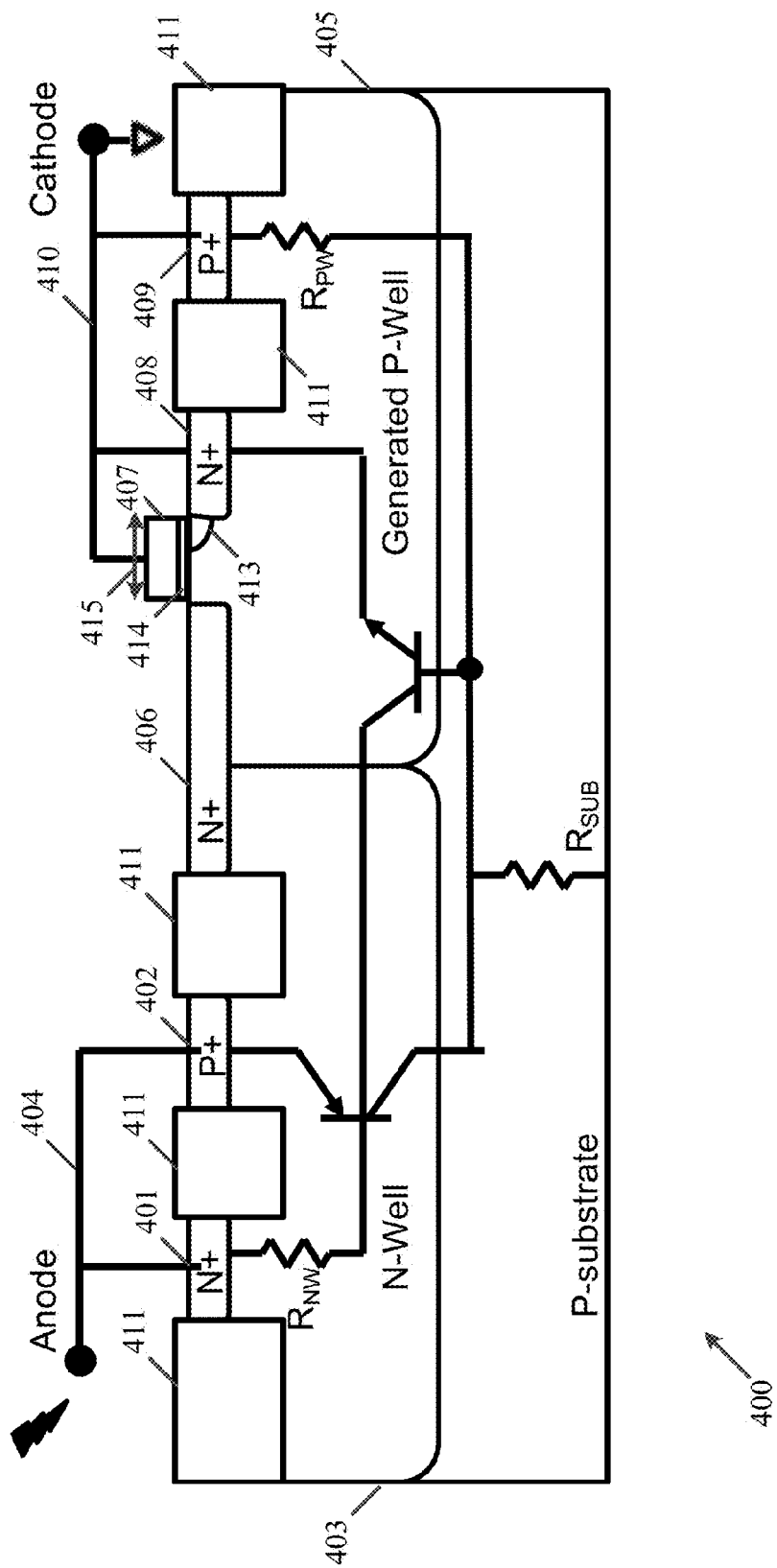
FIG. 4 is a schematic illustration of a construction of a lateral Low Voltage Triggered SCR (LVTSCR), in accordance with some demonstrative embodiments.

Reference is made to FIG. 4, which schematically illustrates a construction of an LVTSCR 400, in accordance with some demonstrative embodiments. For example, the LVTSCR 400 may perform the functionality of SCR 110 (FIG. 1).

In some demonstrative embodiments, LVTSCR 400 may include a one-sided/source sided LDD LVTSCR, e.g., as descried below.

In some demonstrative embodiments, as shown in FIG. 4, the LVTSCR 400 may include an N-type doped active area 401, e.g., an N+ diffusion, and a P-type doped active area 402, e.g., a P+ diffusion.

In some demonstrative embodiments, as shown in FIG. 4, N-type doped active area 401 and P-type doped active area 402 may be placed in an N-well 403.

In some demonstrative embodiments, as shown in FIG. 4, the N-type doped active area 401 and the P-type doped active area 402 may be, for example, shorted to perform the functionality of an anode 404 of the LVTSCR 400. For example, anode 404 may perform the functionality of anode 112 (FIG. 1).

In some demonstrative embodiments, as shown in FIG. 4, the LVTSCR 400 may include a P-Well 405, e.g., adjacent to N-well 403. For example, P-well 405 may perform the functionality of P-well region 136 (FIG. 1).

In some demonstrative embodiments, as shown in FIG. 4, P-well 403 and N-well 405 may contain an N+ diffusion 406 overlapping both P-well 403 and N-well 405. For example, N+ diffusion 406 may perform the functionality of a drain of a MOSFET. For example, N+ diffusion 406 may perform the functionality of N-type drain region 134 (FIG. 1).

In some demonstrative embodiments, as shown in FIG. 4, the LVTSCR 400 may include a gate 407, e.g., situated in the P-well 405. For example, gate 407 may perform the functionality of gate 122 (FIG. 1).

In some demonstrative embodiments, as shown in FIG. 4, gate 407 may include a gate oxide layer 414. For example, gate oxide layer 414 may perform the functionality of gate oxide layer 126 (FIG. 1).

In some demonstrative embodiments, as shown in FIG. 4, the LVTSCR 400 may include an N+ diffusion 408, e.g., situated on a side of the MOSFET opposite to N+ diffusion 406. For example, N+ diffusion 408 may perform the functionality of a source of the MOSFET. For example, N+ diffusion 408 may perform the functionality of N-type source region 132 (FIG. 1).

In some demonstrative embodiments, as shown in FIG. 4, the LVTSCR 400 may include a P+ tap diffusion 409, e.g., in addition to P-type doped active area 402. The P+ tap diffusion 409 may be placed in the P-well 405.

In some demonstrative embodiments, as shown in FIG. 4, P+ tap diffusion 409, N+ diffusion 408, and gate 407 may be shorted together, for example, to perform the functionality of a cathode 410 of the LVTSCR 400. For example, cathode 410 may perform the functionality of cathode 114 (FIG. 1).

In some demonstrative embodiments, a short between gate 407 and N+ diffusion 408 may force the voltage Vgs=0 during a normal operation and, accordingly, the LVTSCR 400 may be off during the normal operation, e.g., except for a low off-leakage current.

In some demonstrative embodiments, as shown in FIG. 4, the LVTSCR 400 may include shallow trench isolations 411 configured to separate and isolate between diffusion active areas, e.g., between P+ tap diffusion 409 and N+ diffusion 408.

In some demonstrative embodiments, as shown in FIG. 4, the MOSFET may include an LDD implant extension 413 of N+ diffusion 408, e.g., under gate 407 and gate oxide layer 414.

In some demonstrative embodiments, LDD implant extension 413 may be employed, for example, at least to minimize hot carrier injection reliability degradation of the MOSFET.

In some demonstrative embodiments, as shown in FIG. 4, the MOSFET may include a one-sided LDD N-type MOSFET, e.g., as described below.

In some demonstrative embodiments, as shown in FIG. 4, N+ diffusion 406 may include a non-LDD N-type drain region.

In some demonstrative embodiments, as shown in FIG. 4, N+ diffusion 406 may not include any light N-type doping, for example, in contrast to N+ diffusion 408, which includes LDD implant extension 413.

In one example, generation of an LDD implant extension, e.g., similar to LDD implant extension 413, may be prevented at N+ diffusion 406, e.g., at an anode ("drain") side of gate 407.

In some demonstrative embodiments, tuning of a triggering voltage of the LVTSCR 400 may be achieved, for example, by reducing a gate length 415 of gate 407.

In some demonstrative embodiments, LVTSCR 400, e.g., with the one-sided LDD N-type MOSFET, may allow an appropriate, e.g., sufficiently low, triggering voltage to be achieved, for example, by tuning the length 415 of gate 407, for example, with low leakage at normal operation, for example, which may be far from a minimum required length of gate 407.

In some demonstrative embodiments, an optimal layout of LVTSCR 400 may be achieved, for example, at a greater gate length, e.g., compared to a two-sided LDD LVTSCR and/or a Non-LDD LVTSCR. A layout with a long gate may be a more safe and/or a more robust layout, which may be far from the minimum size of photolithography and/or potential process variations, e.g., during production of LVTSCR 400.

In some demonstrative embodiments, LVTSCR 400 may be formed as a multi-finger device, and a total width of the device may be scalable, for example, to answer high rating ESD requirements.

Figure 5:
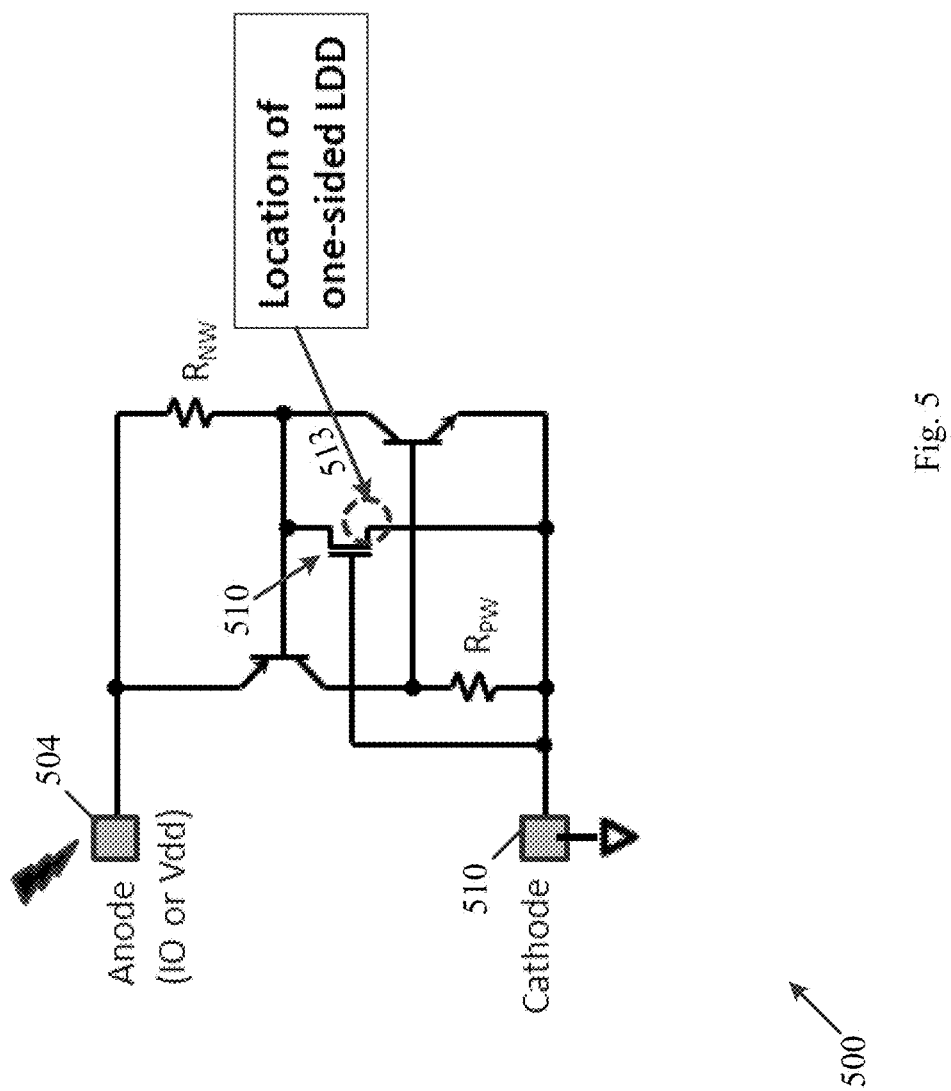
FIG. 5 is a schematic illustration of an electronic scheme of an LVTSCR, in accordance with some demonstrative embodiments.

Reference is made to FIG. 5, which schematically illustrates an electronic scheme of an LVTSCR 500, in accordance with some demonstrative embodiments. For example, LVTSCR 500 may perform the functionality of SCR 110 (FIG. 1) and/or LVTSCR 400 (FIG. 4).

In some demonstrative embodiments, LVTSCR 500 may include an anode 504 and a cathode 510. For example, anode 504 may perform the functionality of anode 112 (FIG. 1) and/or anode 404 (FIG. 1), and/or cathode 410 may perform the functionality of cathode 114 (FIG. 1) and/or cathode 410 (FIG. 4).

In some demonstrative embodiments, as shown in FIG. 5, LVTSCR 500 may include a one-sided LDD N-type MOSFET 510.

In some demonstrative embodiments, as shown in FIG. 5, LVTSCR 500 may include only one LDD implant extension 513, e.g., at the source/cathode side of MOSFET 510.

Figure 6:
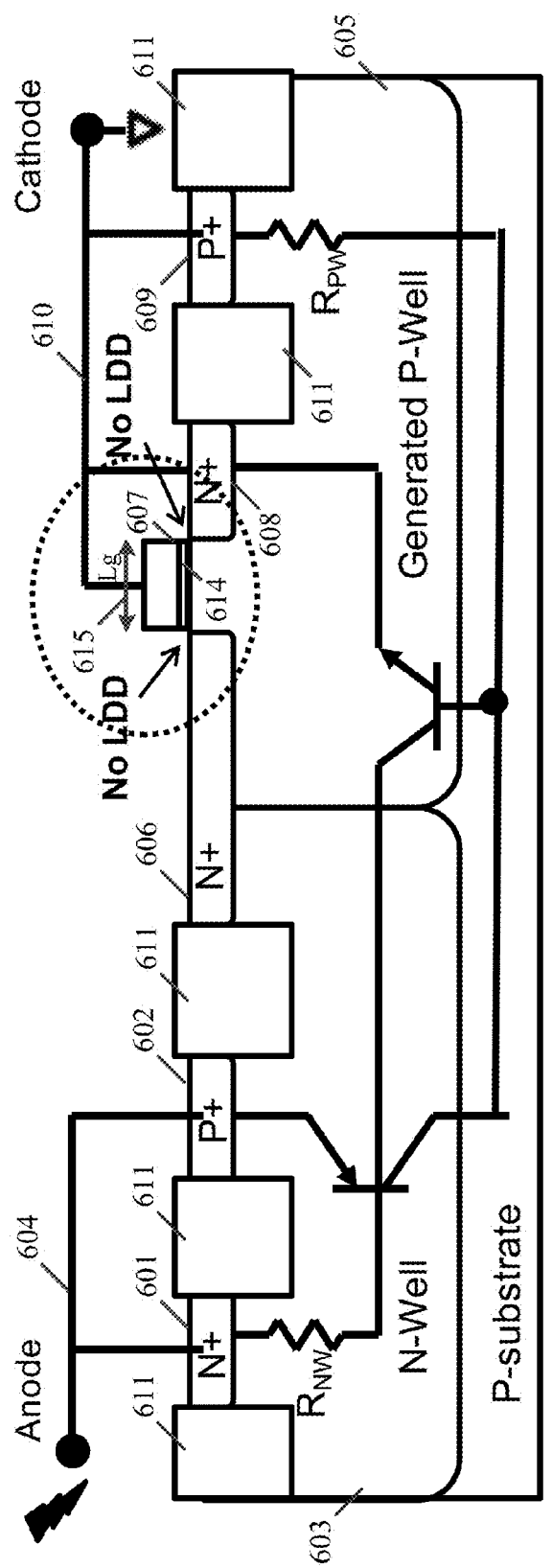
FIG. 6 is a schematic illustration of a construction of an LVTSCR, in accordance with some demonstrative embodiments.

Reference is made to FIG. 6, which schematically illustrates a construction of an LVTSCR 600, in accordance with some demonstrative embodiments. For example, the LVTSCR 600 may perform the functionality of SCR 310 (FIG. 3).

In some demonstrative embodiments, LVTSCR 600 may include a non-LDD LVTSCR, e.g., as described below.

In some demonstrative embodiments, as shown in FIG. 6, the LVTSCR 600 may include an N-type doped active area 601, e.g., an N+ diffusion, and a P-type doped active area 602, e.g., a P+ diffusion.

In some demonstrative embodiments, as shown in FIG. 6, N-type doped active area 601 and P-type doped active area 602 may be placed in an N-well 603.

In some demonstrative embodiments, as shown in FIG. 6, the N-type doped active area 601 and the P-type doped active area 602 may be, for example, shorted to perform the functionality of an anode 604 of the LVTSCR 600. For example, anode 604 may perform the functionality of anode 312 (FIG. 3).

In some demonstrative embodiments, as shown in FIG. 6, the LVTSCR 600 may include a P-Well 605, e.g., adjacent to N-well 603. For example, P-well 605 may perform the functionality of P-well region 336 (FIG. 3).

In some demonstrative embodiments, as shown in FIG. 6, P-well 603 and N-well 605 may contain an N+ diffusion 606 overlapping both P-well 603 and N-well 605. For example, N+ diffusion 606 may perform the functionality of a drain of a MOSFET. For example, N+ diffusion 606 may perform the functionality of N-type drain region 334 (FIG. 1).

In some demonstrative embodiments, as shown in FIG. 6, the LVTSCR 600 may include a gate 607, e.g., situated in the P-well 605. For example, gate 607 may perform the functionality of gate 322 (FIG. 1).

In some demonstrative embodiments, as shown in FIG. 6, gate 607 may include a gate oxide layer 614. For example, gate oxide layer 614 may perform the functionality of gate oxide layer 326 (FIG. 1).

In some demonstrative embodiments, as shown in FIG. 6, the LVTSCR 600 may include an N+ diffusion 608, e.g., situated on a side of the MOSFET opposite to N+ diffusion 606. For example, N+ diffusion 608 may perform the functionality of a source of the MOSFET. For example, N+ diffusion 608 may perform the functionality of N-type source region 332 (FIG. 3).

In some demonstrative embodiments, as shown in FIG. 6, the LVTSCR 600 may include a P+ tap diffusion 609, e.g., in addition to P-type doped active area 602. The P+ tap diffusion 609 may be placed in the P-well 605.

In some demonstrative embodiments, as shown in FIG. 6, P+ tap diffusion 609, N+ diffusion 608, and gate 607 may be shorted together, for example, to perform the functionality of a cathode 610 of the LVTSCR 600. For example, cathode 610 may perform the functionality of cathode 314 (FIG. 1).

In some demonstrative embodiments, a short between gate 607 and N+ diffusion 608 may force the voltage Vgs=0 during a normal operation and, accordingly, the LVTSCR 600 may be in an off-state during a normal operation of a device, e.g., except for a low off-leakage current.

In some demonstrative embodiments, as shown in FIG. 6, the LVTSCR 600 may include shallow trench isolations 611 configured to separate and isolate between diffusion active areas, e.g., between P+ tap diffusion 609 and N+ diffusion 608.

In some demonstrative embodiments, as shown in FIG. 6, the MOSFET may include a non-LDD N-type MOSFET, e.g., as described below.

In some demonstrative embodiments, as shown in FIG. 6, N+ diffusion 606 may include a non-LDD N-type drain region.

In some demonstrative embodiments, as shown in FIG. 6, N+ diffusion 608 may include a non-LDD N-type source region.

In some demonstrative embodiments, as shown in FIG. 6, both N+ diffusion 606 and N+ diffusion 608 may not include any light N-type doping, for example, in contrast to N+ diffusion 408 (FIG. 4), which includes LDD implant extension 413 (FIG. 4), and/or in contrast to a two-sided LDD LVTSCR.

In one example, generation of an LDD implant extension, e.g., similar to LDD implant extension 413 (FIG. 4), may be prevented at both at N+ diffusion 606 and N+ diffusion 608, e.g., on both an anode ("drain") side and a cathode ("source") side of gate 607.

In some demonstrative embodiments, tuning of a triggering voltage of the LVTSCR 600 may be achieved, for example, by reducing a gate length 615 of gate 607.

In some demonstrative embodiments, reducing the gate length 615 may result in a reduction of a triggering voltage to trigger LVTSCR 600, for example, by lowering a $BV_{DSS}$ voltage of gate 607.

In some demonstrative embodiments, LVTSCR 600, e.g., with the non-LDD N-type MOSFET, may allow an appropriate, e.g., sufficiently low, triggering voltage to be achieved, for example, by tuning the length 615 of gate 607, e.g., with low leakage at normal operation, for example, which may be far from a minimum required length of gate 607.

In some demonstrative embodiments, lowering the $BV_{DSS}$ voltage may result in charge carriers to trigger LVTSCR 600, e.g., a parasitic SCR, at a lower voltage. This may be in contrast to a result of reducing the gate length 615 in a two-sided LVTSCR, e.g., having LDD implant extensions at both sides of the gate, which may cause significant increase of an off-leakage current, e.g., before the triggering voltage may be low enough to enable a proper ESD window margin, e.g., as described above with reference to FIG. 2.

In one example, removing the LDD implant extensions from both sides of gate 607 may prevent an excessive current, e.g., at a short gate length 615. For example, an internal 5V gate length may be reduced down to 0.18 µm, which is a minimum design rule of a gate length of the technology.

In some demonstrative embodiments, LVTSCR 600 may be formed as a multi-finger device, and a total width of the device may be scalable, for example, to answer high rating ESD requirements.

Figure 7:
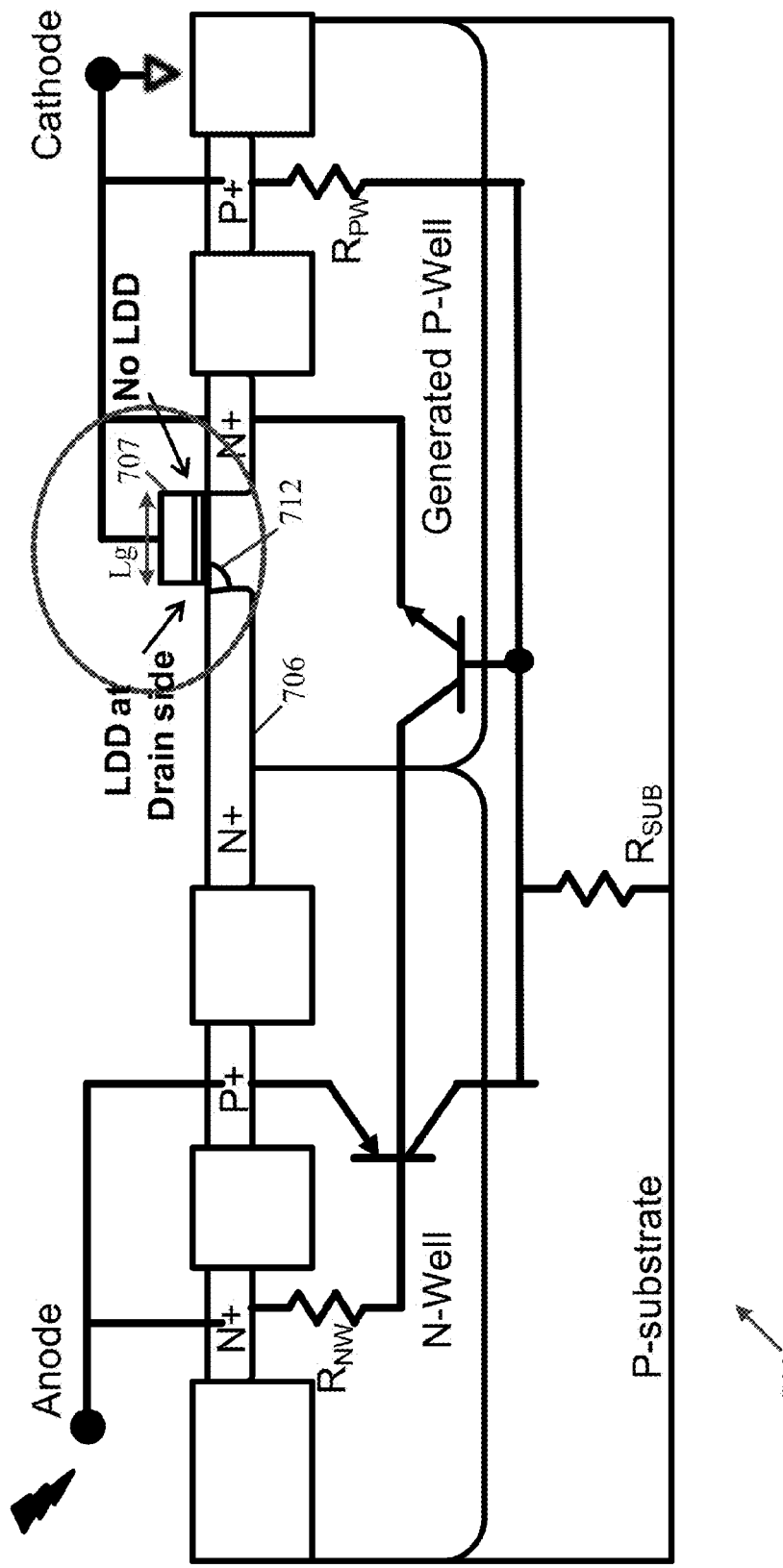
FIG. 7 is a schematic illustration of a construction of an LVTSCR, in accordance with some demonstrative embodiments.

Reference is made to FIG. 7, which schematically illustrates a construction of an LVTSCR 700, in accordance with some demonstrative embodiments.

In some demonstrative embodiments, LVTSCR 700 may include a drain-side LDD LVTSCR, e.g., as described below.

In some demonstrative embodiments, an LDD implant extension may be attached to a drain region of a gate, e.g., instead of the source region of the gate, for example, as described above with respect to LDD implant extension 413 (FIG. 4).

In some demonstrative embodiments, LVTSCR 700 may include a drain-side LDD N-type MOSFET, in which an N+ diffusion 706, e.g., on a drain side of a gate 707 of the MOSFET, may have an LDD implant extension 712.

In some demonstrative embodiments, in some cases and/or implementations using LVTSCR 700 including a drain side LDD N-type MOSFET may not be advantageous.

In some demonstrative embodiments, in some cases and/or implementations using LVTSCR 700 may deteriorate a performance, for example, LVTSCR 700 may have higher triggering voltage values, and/or a reduced ESD design window 230 (FIG. 2).

In one example, the triggering voltage values to trigger LVTSCR 700 may be much higher, e.g., compared to triggering voltage values to trigger LVTSCR 600 (FIG. 6) and/or LVTSCR 400 (FIG. 4). According to this example, tuning of the triggering voltage, e.g., by reducing a length of gate 707 may not be effective. Accordingly, a side, e.g., a drain side or source side of gate 707, in which the LDD implant extension 712 is added, may be crucial.

Referring back to FIG. 1, a feasibility of reducing triggering voltage of an SCR, e.g., SCR 100, SCR 300 (FIG. 3), LVTSCR 400 (FIG. 4), and/or LVTSCR 600 (FIG. 6), has been validated on Si.

The feasibility of reducing the triggering voltage of the SCR, in accordance with some demonstrative embodiments, was measured, e.g., using four different device layouts. The feasibility of reducing the triggering voltage of the SCR was measured by a first measurement using a common two-sided LDD LVTSCR, a second measurement using a non-LDD LVTSCR, e.g., LVTSCR 600 (FIG. 6), a third measurement using a one-sided/source-sided LDD LVTSCR, e.g., LVTSCR 400 (FIG. 4), and/or a fourth measurement using a drain-sided LDD LVTSCR, e.g., LVTSCR 700 (FIG. 7).

In some demonstrative embodiments, a gate length in all four different devices was varied from wide value down to a minimum design rule length.

In some demonstrative embodiments, ESD key point parameters were measured using Transmission Line Pulse (TLP), which may be the industry benchmark method for characterization of ESD devices.

In one example, as discussed below, the TLP may be a common method to characterize ESD devices, and the TLP may be correlated to a Human Body Model (HBM) and/or to a Machine Model (MM) ESD stress.

In some demonstrative embodiments, results of the four measurements, e.g., with respect to a triggering voltage and leakages at a nominal voltage, show an advantage of the one-sided LDD LVTSCR, e.g., over the other device layouts, for 3.3V devices, e.g., having an operational voltage of 3.3V, and for 5V devices, e.g., having an operational voltage of 5V.

In one example, as discussed below, the advantage may be observed by scatter plots of a triggering voltage ("Vt1") versus a leakage current. In both 3.3V devices and 5V devices, a combination of a voltage value of the triggering voltage and a current value of the leakage current may of the one-sided LDD LVTSCR may be better or may coincide with the non-LDD LVTSCR, and may be a lot better compared to the two-sided LVTSCR.

Figures 8A, 8B:
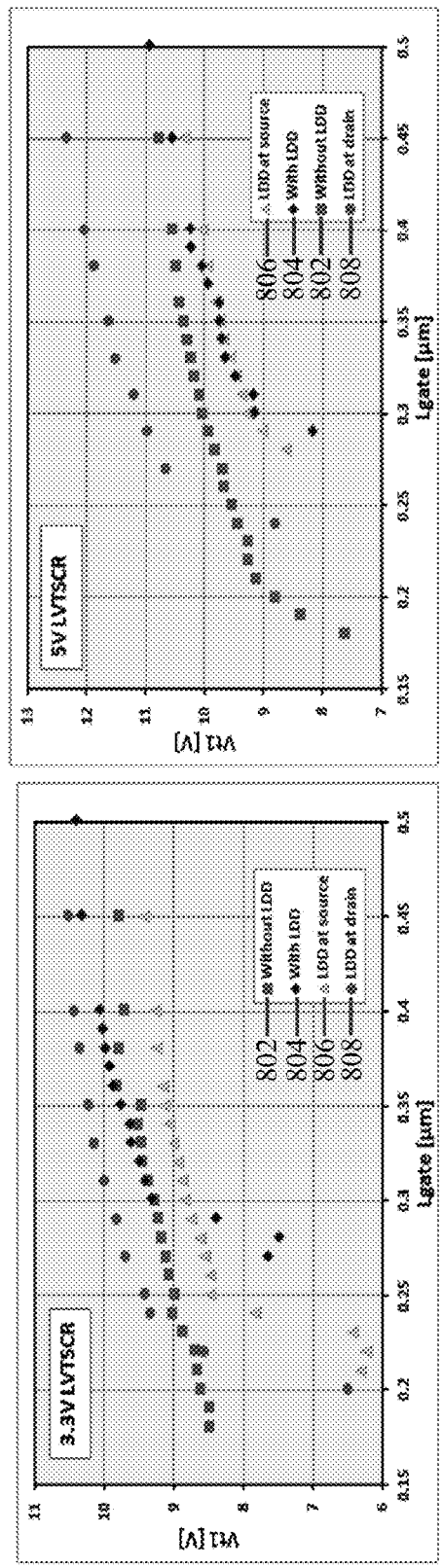
FIGS. 8A and 8B are schematic illustrations of graphs depicting a triggering voltage of an LVTSCR versus a gate length of a gate of the LVTSCR, in accordance with some demonstrative embodiments.

Reference is made to FIGS. 8A and 8B, which depict a triggering voltage of an LVTSCR versus a gate length of a gate of the LVTSCR, in accordance with some demonstrative embodiments. FIG. 8A depicts the triggering voltage versus the gate length for the 3.3V devices, and FIG. 8B depicts the triggering voltage versus the gate length for the 5V devices.

In some demonstrative embodiments, as shown in FIGS. 8A and 8B, the triggering voltage versus the gate length were measured in four different layouts, e.g., a non-LDD LVTSCR 802, a two-sided LDD 804, a one-sided/source-side LDD LVTSCR 806, and the drain-side LDD LVTSCR 808.

In some demonstrative embodiments, as shown in FIGS. 8A and 8B, results with respect to various gate lengths of the gate for the one-sided LDD LVTSCR 806 are better than or coincide with the results for non-LDD LVTSCR 802.

Figures 9A, 9B:
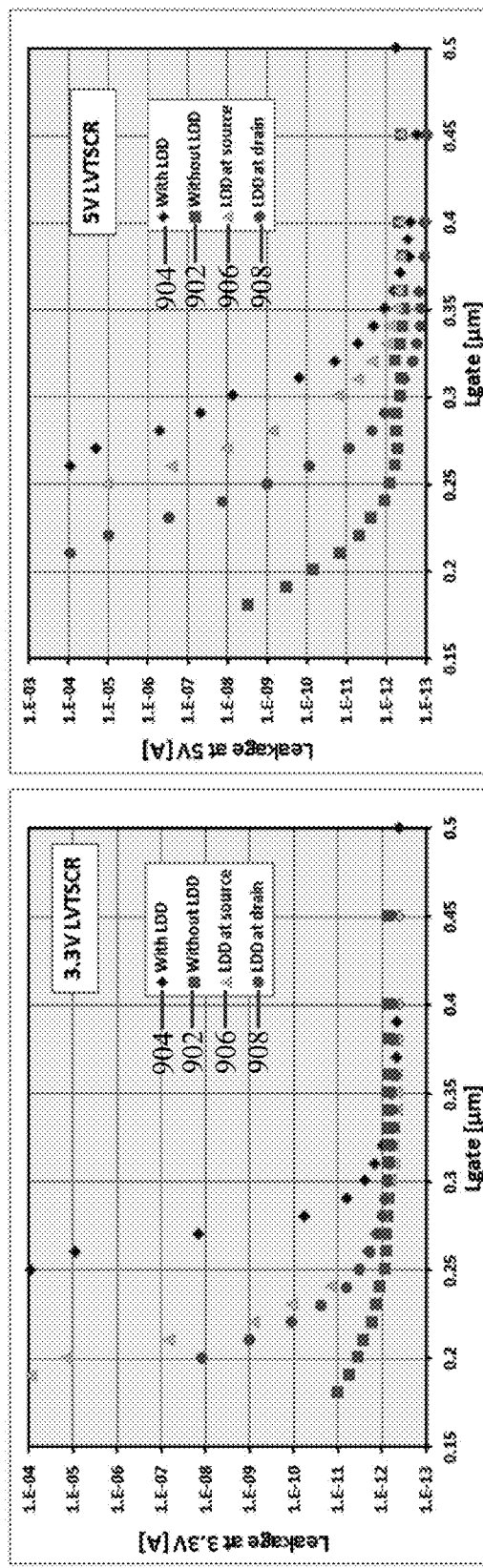
FIGS. 9A and 9B are schematic illustrations of graphs depicting a leakage current of an LVTSCR versus a gate length of a gate of the LVTSCR, in accordance with some demonstrative embodiments.

Reference is made to FIGS. 9A and 9B, which depict a leakage current of an LVTSCR, e.g., in the off state of the LVTSCR, versus a gate length of a gate of the LVTSCR, in accordance with some demonstrative embodiments.

In some demonstrative embodiments, FIG. 9A depicts the leakage current versus the gate length for the 3.3V devices, and FIG. 9B depicts the leakage current versus the gate length for the 5V devices.

In some demonstrative embodiments, as shown in FIGS. 9A and 9B, the triggering voltage versus the gate length were measured in four different layouts, e.g., a non-LDD LVTSCR 902, a two-sided LDD 904, a one-sided LDD LVTSCR 906, and the drain-side LDD LVTSCR 908.

In some demonstrative embodiments, as shown in FIGS. 9A and 9B, the one-sided LDD LVTSCR 906 and the non-LDD LVTSCR 902 may enable using a reduced size gate length while maintaining a low leakage current, e.g., compared to the two-sided LDD LVTSCR 904.

Figures 10A, 10B:
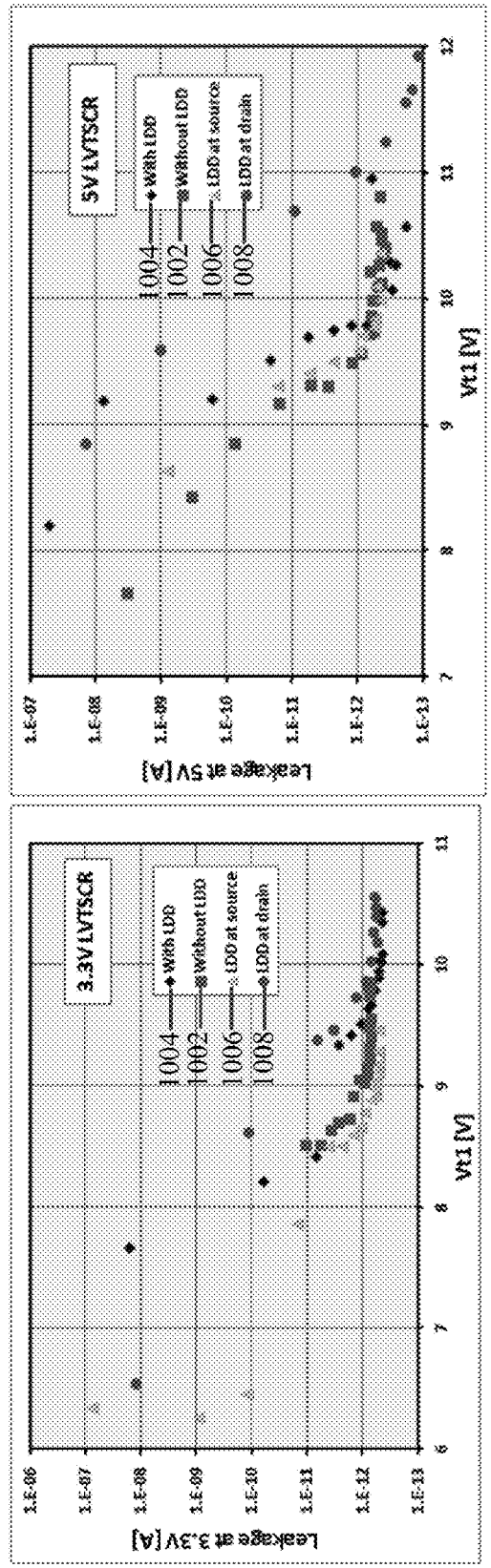
FIGS. 10A and 10B are schematic illustrations of graphs depicting a leakage current of an LVTSCR versus a triggering voltage of the LVTSCR, in accordance with some demonstrative embodiments.

Reference is made to FIGS. 10A and 10B, which depict a leakage current of an LVTSCR, e.g., in the off state of the LVTSCR, versus a triggering voltage of the LVTSCR, in accordance with some demonstrative embodiments.

In some demonstrative embodiments, FIG. 10A depicts the leakage current versus the triggering voltage for the 3.3V devices, and FIG. 10B depicts the leakage current versus the triggering voltage for the 5V devices.

In some demonstrative embodiments, as shown in FIGS. 10A and 10B, the triggering voltage versus the gate length were measured in four different layouts, e.g., a non-LDD LVTSCR 1002, a two-sided LDD 1004, a one-sided LDD LVTSCR 1006, and the drain-side LDD LVTSCR 1008.

In some demonstrative embodiments, as shown in FIGS. 10A and 10B, results with respect to a value of the leakage current for a voltage value of the triggering voltage for one-sided LDD LVTSCR 1006 and the non-LDD LVTSCR 1002 are kept low.

In some demonstrative embodiments, as shown in FIGS. 10A and 10B, results with respect to the value of the leakage current for a voltage value of the triggering voltage for one-sided LDD LVTSCR 1006 are lower than or coincide with the results of the non-LDD LVTSCR 1002.

In some demonstrative embodiments, as shown in FIGS. 10A and 10B, results with respect to the value of the leakage current for a voltage value of the triggering voltage for the one-sided LDD LVTSCR 1006 are much lower than the results of the two sided LVTSCR 1004.

EXAMPLES

The following examples pertain to further embodiments.

Example 1 includes a silicon controlled rectifier (SCR) comprising a metal-oxide-semiconductor field-effect transistor (MOSFET), the MOSFET comprising a gate; an N-type source region; a non-Lightly Doped Drain (LDD) N-type drain region; and a P-Well region extending between the N-type source region and the non-LDD N-type drain region, and extending between the non-LDD N-type drain region and a drain region of the gate.

Example 2 includes the subject matter of Example 1, and optionally, wherein the P-Well region is in direct contact with the drain region of the gate.

Example 3 includes the subject matter of Example 1 or 2, and optionally, wherein the P-Well region fills an entire area under the drain region of the gate.

Example 4 includes the subject matter of any one of Examples 1-3, and optionally, wherein the P-Well region separates between the non-LDD N-type drain region and the drain region of the gate.

Example 5 includes the subject matter of any one of Examples 1-4, and optionally, wherein an entirety of the non-LDD N-type drain region is uniformly doped.

Example 6 includes the subject matter of any one of Examples 1-5, and optionally, wherein an entirety of the non-LDD N-type drain region is heavily doped.

Example 7 includes the subject matter of any one of Examples 1-6, and optionally, wherein the non-LDD N-type drain region does not include any light N-type doping.

Example 8 includes the subject matter of any one of Examples 1-7, and optionally, wherein the N-type source region comprises a heavily doped region, and an LDD region comprising light N-type doping, the LDD region extending between the P-well region and a source region of the gate.

Example 9 includes the subject matter of Example 8, and optionally, wherein the LDD region is in direct contact with the source region of the gate.

Example 10 includes the subject matter of any one of Examples 1-7, and optionally, wherein the N-type source region entirely comprises a non-LDD N-type source region, the P-Well region extending between the non-LDD N-type source region and a source region of the gate.

Example 11 includes the subject matter of Example 10, and optionally, wherein the P-Well region is in direct contact with an entire region of the gate between the non-LDD N-type source region and the non-LDD N-type drain region.

Example 12 includes the subject matter of Example 10 or 11, and optionally, wherein the P-Well region fills an entire area between the non-LDD N-type source region and the non-LDD N-type drain region.

Example 13 includes the subject matter of any one of Examples 10-12, and optionally, wherein the P-Well region fills an entire area under the gate.

Example 14 includes the subject matter of any one of Examples 10-13, and optionally, wherein the non-LDD N-type source region and the non-LDD N-type drain region do not include Light N-type doping.

Example 15 includes the subject matter of any one of Examples 10-14, and optionally, wherein the gate comprises a gate oxide layer and a polysilicon layer, the P-Well region fills an entire area under the gate oxide layer.

Example 16 includes the subject matter of any one of Examples 1-15, and optionally, wherein the SCR is configured to be triggered at a triggering voltage value, a gate length of the gate is based on the triggering voltage value.

Example 17 includes the subject matter of any one of Examples 1-16 comprising a lateral Low Voltage Triggered SCR (LVTSCR).

Example 18 includes a silicon controlled rectifier (SCR) comprising a one-sided Lightly Doped Drain (LDD) N-type metal-oxide-semiconductor field-effect transistor (MOSFET), the one-sided LDD N-Type MOSFET comprising a gate; an N-type source region; an N-type drain region; and a P-Well region, wherein, from the N-type drain region and the N-type source region, only the N-type source region comprises an LDD N-type region.

Example 19 includes the subject matter of Example 18, and optionally, wherein the N-type source region comprises a heavily doped region and the LDD N-Type region, the LDD N-Type region comprising light N-type doping, the heavily doped region comprising heavy N-type doping.

Example 20 includes the subject matter of Example 19, and optionally, wherein the LDD N-Type region extends between the P-well region and a source region of the gate.

Example 21 includes the subject matter of Example 19 or 20, and optionally, wherein the LDD N-Type region is in direct contact with a source region of the gate.

Example 22 includes the subject matter of any one of Examples 18-21, and optionally, wherein the N-type drain region comprises a non-LDD N-type drain region, the P-Well region extending between the non-LDD N-type drain region and a drain region of the gate.

Example 23 includes the subject matter of Example 22, and optionally, wherein the P-Well region is in direct contact with the drain region of the gate.

Example 24 includes the subject matter of Example 22 or 23, and optionally, wherein the P-Well region fills an entire area under the drain region of the gate.

Example 25 includes the subject matter of any one of Examples 22-24, and optionally, wherein the P-Well region separates between the non-LDD N-type drain region and the drain region of the gate.

Example 26 includes the subject matter of any one of Examples 22-25, and optionally, wherein an entirety of the non-LDD N-type drain region is uniformly doped.

Example 27 includes the subject matter of any one of Examples 22-26, and optionally, wherein an entirety of the non-LDD N-type drain region is heavily doped.

Example 28 includes the subject matter of Example 22, and optionally, wherein the non-LDD N-type drain region does not include any light N-type doping.

Example 29 includes the subject matter of any one of Examples 18-28, and optionally, wherein the SCR is configured to be triggered at a triggering voltage value, and a gate length of the gate is based on the triggering voltage value.

Example 30 includes the subject matter of any one of Examples 18-29 comprising a lateral Low Voltage Triggered SCR (LVTSCR).

Example 31 includes a complementary metal-oxide-semiconductor (CMOS) integrated circuit (IC) comprising at least one electrical component; and at lease one silicon controlled rectifier (SCR) configured to, responsive to a predefined electrostatic discharge (ESD) voltage, shunt ESD currents from the electrical component, the SCR comprising a metal-oxide-semiconductor field-effect transistor (MOSFET), the MOSFET comprising a gate; an N-type source region; a non-Lightly Doped Drain (LDD) N-type drain region; and a P-Well region extending between the N-type source region and the non-LDD N-type drain region, and extending between the non-LDD N-type drain region and a drain region of the gate.

Example 32 includes the subject matter of Example 31, and optionally, wherein the P-Well region is in direct contact with the drain region of the gate.

Example 33 includes the subject matter of Example 31 or 32, and optionally, wherein the P-Well region fills an entire area under the drain region of the gate.

Example 34 includes the subject matter of any one of Examples 31-33, and optionally, wherein the P-Well region separates between the non-LDD N-type drain region and the drain region of the gate.

Example 35 includes the subject matter of any one of Examples 31-34, and optionally, wherein an entirety of the non-LDD N-type drain region is uniformly doped.

Example 36 includes the subject matter of any one of Examples 31-35, and optionally, wherein an entirety of the non-LDD N-type drain region is heavily doped.

Example 37 includes the subject matter of any one of Examples 31-36, and optionally, wherein the non-LDD N-type drain region does not include any light N-type doping.

Example 38 includes the subject matter of any one of Examples 31-37, and optionally, wherein the N-type source region comprises a heavily doped region, and an LDD region comprising light N-type doping, the LDD region extending between the P-well region and a source region of the gate.

Example 39 includes the subject matter of Example 38, and optionally, wherein the LDD region is in direct contact with the source region of the gate.

Example 40 includes the subject matter of any one of Examples 31-37, and optionally, wherein the N-type source region entirely comprises a non-LDD N-type source region, the P-Well region extending between the non-LDD N-type source region and a source region of the gate.

Example 41 includes the subject matter of Example 40, and optionally, wherein the P-Well region is in direct contact with an entire region of the gate between the non-LDD N-type source region and the non-LDD N-type drain region.

Example 42 includes the subject matter of Example 40 or 41, and optionally, wherein the P-Well region fills an entire area between the non-LDD N-type source region and the non-LDD N-type drain region.

Example 43 includes the subject matter of any one of Examples 40-42, and optionally, wherein the P-Well region fills an entire area under the gate.

Example 44 includes the subject matter of any one of Examples 40-43, and optionally, wherein the non-LDD N-type source region and the non-LDD N-type drain region do not include Light N-type doping.

Example 45 includes the subject matter of any one of Examples 40-44, and optionally, wherein the gate comprises a gate oxide layer and a polysilicon layer, the P-Well region fills an entire area under the gate oxide layer.

Example 46 includes the subject matter of any one of Examples 31-45, and optionally, wherein the SCR is configured to be triggered at a triggering voltage value, a gate length of the gate is based on the triggering voltage value.

Example 47 includes the subject matter of any one of Examples 31-46, and optionally, wherein the SCR comprises a lateral Low Voltage Triggered SCR (LVTSCR).

Example 48 includes a complementary metal-oxide-semiconductor (CMOS) integrated circuit (IC) comprising at least one electrical component; and at lease one silicon controlled rectifier (SCR) configured to, responsive to a predefined electrostatic discharge (ESD) voltage, shunt ESD currents from the electrical component, the SCR comprising a one-sided Lightly Doped Drain (LDD) N-type metal-oxide-semiconductor field-effect transistor (MOSFET), the one-sided LDD N-Type MOSFET comprising a gate; an N-type source region; an N-type drain region; and a P-Well region, wherein, from the N-type drain region and the N-type source region, only the N-type source region comprises an LDD N-type region.

Example 49 includes the subject matter of Example 48, and optionally, wherein the N-type source region comprises a heavily doped region and the LDD N-Type region, the LDD N-Type region comprising light N-type doping, the heavily doped region comprising heavy N-type doping.

Example 50 includes the subject matter of Example 49, and optionally, wherein the LDD N-Type region extends between the P-well region and a source region of the gate.

Example 51 includes the subject matter of Example 49 or 50, and optionally, wherein the LDD N-Type region is in direct contact with a source region of the gate.

Example 52 includes the subject matter of any one of Examples 48-51, and optionally, wherein the N-type drain region comprises a non-LDD N-type drain region, the P-Well region extending between the non-LDD N-type drain region and a drain region of the gate.

Example 53 includes the subject matter of Example 52, and optionally, wherein the P-Well region is in direct contact with the drain region of the gate.

Example 54 includes the subject matter of Example 52 or 53, and optionally, wherein the P-Well region fills an entire area under the drain region of the gate.

Example 55 includes the subject matter of any one of Examples 52-54, and optionally, wherein the P-Well region separates between the non-LDD N-type drain region and the drain region of the gate.

Example 56 includes the subject matter of any one of Examples 52-55, and optionally, wherein an entirety of the non-LDD N-type drain region is uniformly doped.

Example 57 includes the subject matter of any one of Examples 52-56, and optionally, wherein an entirety of the non-LDD N-type drain region is heavily doped.

Example 58 includes the subject matter of Example 52, and optionally, wherein the non-LDD N-type drain region does not include any light N-type doping.

Example 59 includes the subject matter of any one of Examples 48-58, and optionally, wherein the SCR is configured to be triggered at a triggering voltage value, and a gate length of the gate is based on the triggering voltage value.

Example 60 includes the subject matter of any one of Examples 48-59, and optionally, wherein the SCR comprises a lateral Low Voltage Triggered SCR (LVTSCR).

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. A silicon controlled rectifier (SCR) comprising a metal-oxide-semiconductor field-effect transistor (MOSFET), the MOSFET comprising:
a gate;
an N-type source region comprising a heavily doped region and a Lightly Doped Drain
(LDD) region comprising light N-type doping;
a non-LDD N-type drain region; and
a P-Well region extending between said N-type source region and said non-LDD N-type drain region, and extending between said non-LDD N-type drain region and a drain region of said gate, the LDD region extending between said P-well region and a source region of said gate, said LDD region is in direct contact with the source region of said gate.

2. The SCR of claim 1, wherein said P-Well region is in direct contact with the drain region of said gate.

3. The SCR of claim 1, wherein said P-Well region fills an entire area under the drain region of said gate.

4. The SCR of claim 1, wherein said P-Well region separates between said non-LDD N-type drain region and the drain region of said gate.

5. The SCR of claim 1, wherein an entirety of said non-LDD N-type drain region is uniformly doped.

6. The SCR of claim 1, wherein an entirety of said non-LDD N-type drain region is heavily doped.

7. The SCR of claim 1, wherein said non-LDD N-type drain region does not include any light N-type doping.

8. The SCR of claim 1, wherein said SCR is configured to be triggered at a triggering voltage value, a gate length of said gate is based on said triggering voltage value.

9. The SCR of claim 1 comprising a lateral Low Voltage Triggered SCR (LVTSCR).

10. A silicon controlled rectifier (SCR) comprising a one-sided Lightly Doped Drain (LDD) N-type metal-oxide-semiconductor field-effect transistor (MOSFET), the one-sided LDD N-Type MOSFET comprising:
a gate;
an N-type source region;
an N-type drain region; and
a P-Well region,
wherein, from said N-type drain region and said N-type source region, only said N-type source region comprises an LDD N-type region, wherein said N-type drain region comprises a non-LDD N-type drain region, said P-Well region extending between said non-LDD N-type drain region and a drain region of said gate.

11. The SCR of claim 10, wherein said LDD N-Type region extends between said P-well region and a source region of said gate.

12. The SCR of claim 10, wherein said LDD N-Type region is in direct contact with a source region of said gate.

13. The SCR of claim 10, wherein said P-Well region is in direct contact with the drain region of said gate.

14. The SCR of claim 10, wherein said P-Well region fills an entire area under the drain region of said gate.

15. The SCR of claim 10, wherein an entirety of said non-LDD N-type drain region is uniformly doped.

16. The SCR of claim 10, wherein an entirety of said non-LDD N-type drain region is heavily doped.

17. The SCR of claim 10, wherein said non-LDD N-type drain region does not include any light N-type doping.

18. The SCR of claim 10, wherein said N-type source region comprises a heavily doped region and said LDD N-Type region, said LDD N-Type region comprising light N-type doping, said heavily doped region comprising heavy N-type doping.

19. The SCR of claim 10, wherein said P-Well region separates between said non-LDD N-type drain region and the drain region of said gate.

20. A complementary metal-oxide-semiconductor (CMOS) integrated circuit (IC) comprising:
at least one electrical component; and
at least one silicon controlled rectifier (SCR) comprising a one-sided Lightly Doped Drain (LDD) N-type metal-oxide-semiconductor field-effect transistor (MOSFET), the one-sided LDD N-Type MOSFET comprising:
a gate;
an N-type source region;
an N-type drain region; and
a P-Well region,
wherein, from said N-type drain region and said N-type source region, only said N-type source region comprises an LDD N-type region.

21. The CMOS IC of claim 20, wherein said SCR is configured to be triggered at a triggering voltage value, a gate length of said gate is based on said triggering voltage value.

22. The CMOS IC of claim 20, wherein said N-type source region comprises a heavily doped region and said LDD N-Type region, said LDD N-Type region comprising light N-type doping, said heavily doped region comprising heavy N-type doping.

* * * * *